(12) United States Patent
Hamada et al.

(10) Patent No.: US 12,464,722 B2
(45) Date of Patent: Nov. 4, 2025

(54) THREE-DIMENSIONAL TYPE NAND MEMORY DEVICE

(71) Applicant: Kioxia Corporation, Tokyo (JP)

(72) Inventors: Tatsufumi Hamada, Nagoya Aichi (JP); Yosuke Mitsuno, Yokkaichi Mie (JP); Tomohiro Kuki, Yokkaichi Mie (JP); Yusuke Morikawa, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 583 days.

(21) Appl. No.: 17/842,411

(22) Filed: Jun. 16, 2022

(65) Prior Publication Data

US 2023/0292518 A1 Sep. 14, 2023

(30) Foreign Application Priority Data

Mar. 10, 2022 (JP) .................. 2022-037175

(51) Int. Cl.
*H10B 43/35* (2023.01)
*H10B 41/10* (2023.01)
*H10B 41/27* (2023.01)
*H10B 41/35* (2023.01)
*H10B 43/10* (2023.01)
*H10B 43/27* (2023.01)

(52) U.S. Cl.
CPC ............. *H10B 43/35* (2023.02); *H10B 41/10* (2023.02); *H10B 41/27* (2023.02); *H10B 41/35* (2023.02); *H10B 43/10* (2023.02); *H10B 43/27* (2023.02)

(58) Field of Classification Search
CPC ........ H10B 43/35; H10B 43/10; H10B 43/27; H10B 41/10; H10B 41/27; H10B 41/35; H10D 64/037
See application file for complete search history.

(56) References Cited

U.S. PATENT DOCUMENTS

| | | |
|---|---|---|
| 2018/0331119 A1 | 11/2018 | Kim et al. |
| 2020/0119038 A1* | 4/2020 | Hopkins ............... H10B 43/27 |
| 2020/0227432 A1* | 7/2020 | Lai ......................... H10B 43/35 |
| 2020/0321351 A1* | 10/2020 | Kim ....................... H10B 43/35 |
| 2022/0359767 A1* | 11/2022 | Goda .................... H10D 30/751 |

* cited by examiner

*Primary Examiner* — Marlon T Fletcher
*Assistant Examiner* — Christina A Sylvia
(74) *Attorney, Agent, or Firm* — Holtz, Holtz & Volek PC

(57) ABSTRACT

In one embodiment, a method of manufacturing a semiconductor device includes forming a stacked film alternately including first layers and second layers in a first direction, forming a hole extending in the first direction in the stacked film, and forming a first insulator on a side face of the stacked film in the hole. The method further includes removing the first insulator in the hole to expose a first part of the side face of the stacked film at a predetermined height in the first direction of the hole and to expose a side face of the first insulator remaining on a second part of the side face of the stacked film at the predetermined height. The method further includes forming a second insulator on the first part of the side face of the stacked film and the side face of the remaining first insulator in the hole.

10 Claims, 16 Drawing Sheets

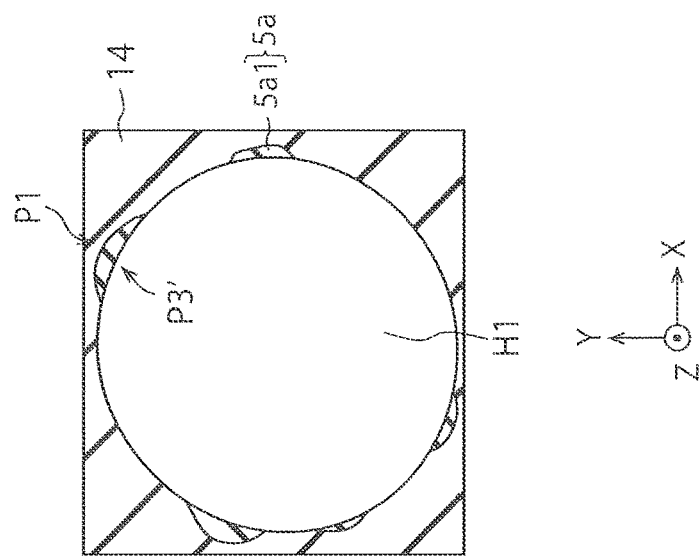
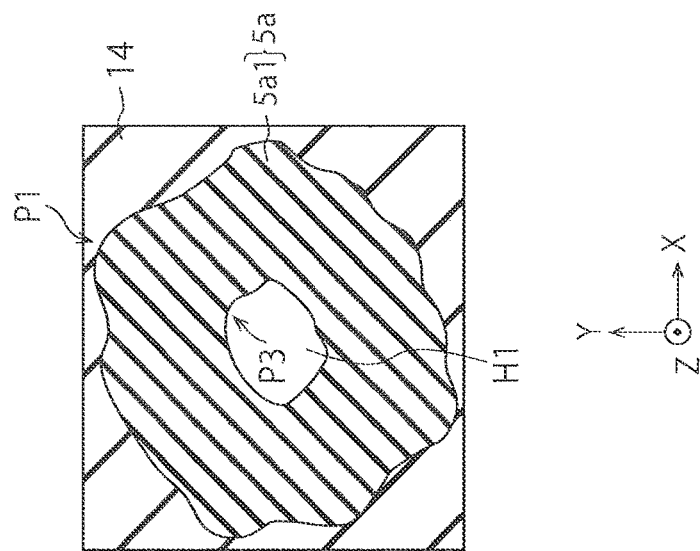
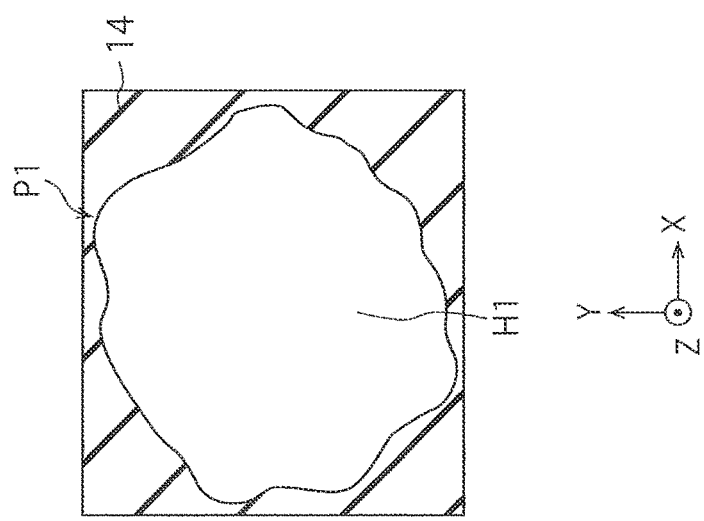

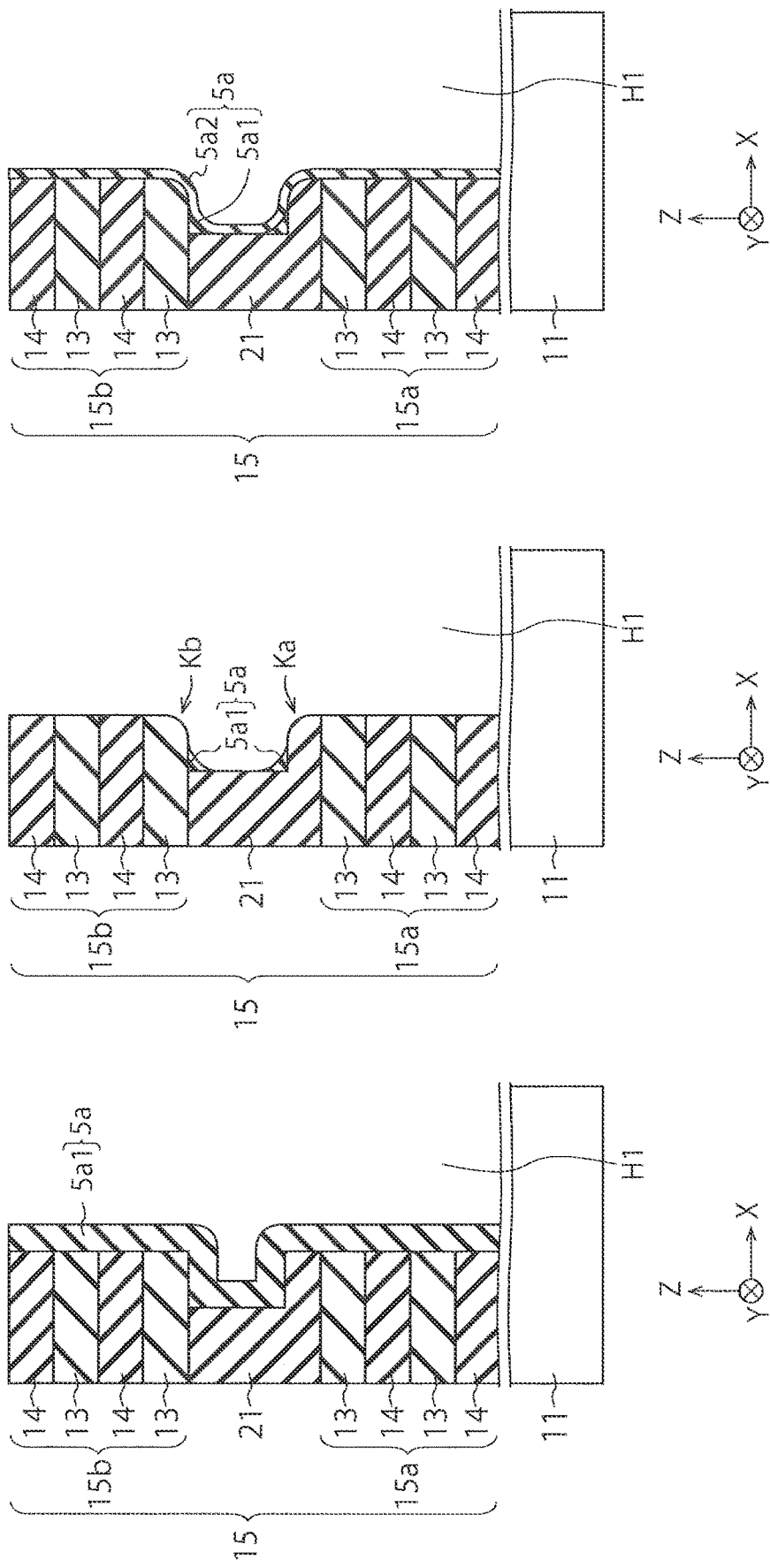

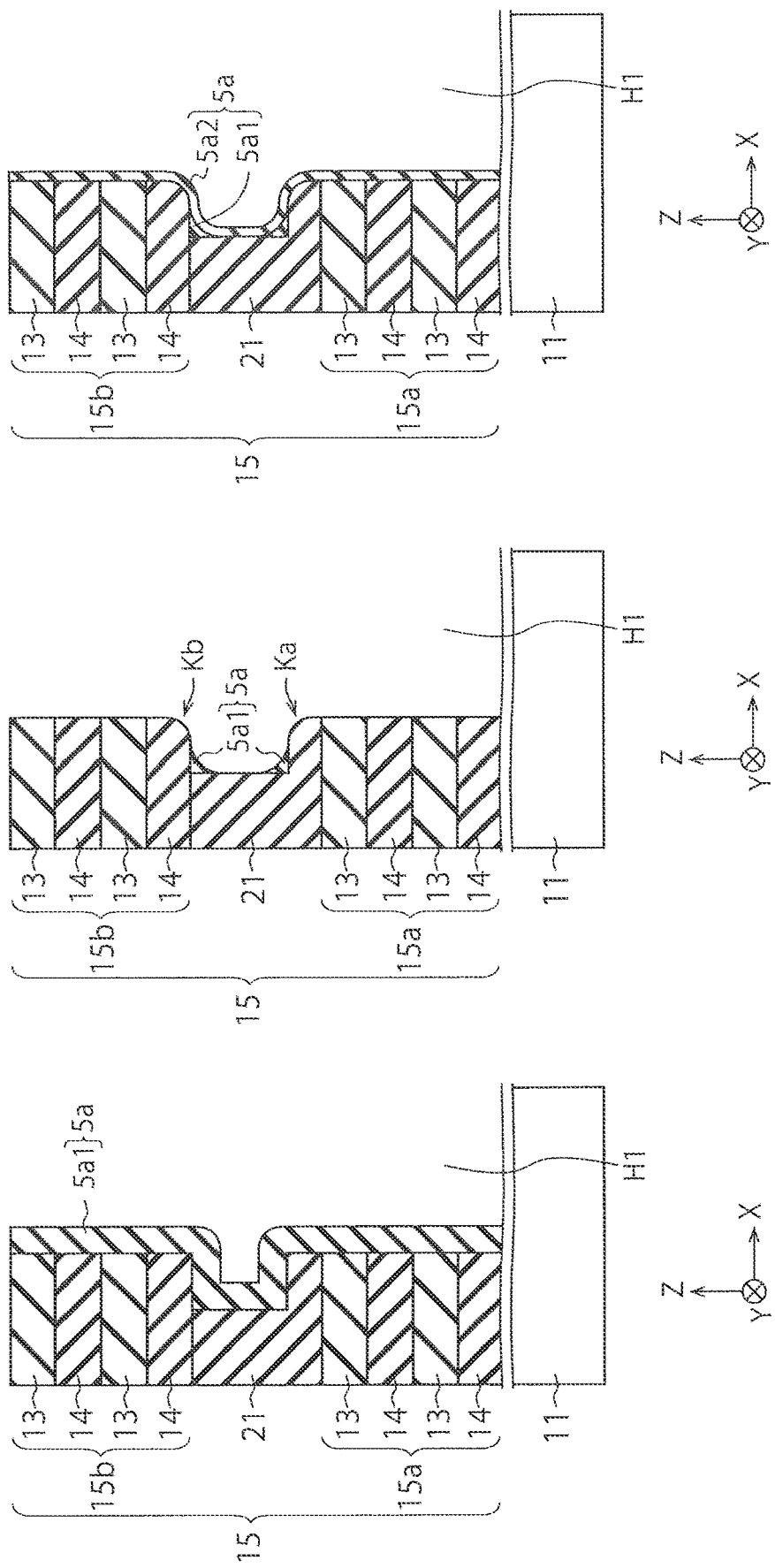

THREE-DIMENSIONAL TYPE NAND MEMORY DEVICE

CROSS-REFERENCE TO RELATED APPLICATIONS

This application is based upon and claims the benefit of priority from the prior Japanese Patent Application No. 2022-037175, filed on Mar. 10, 2022, the entire contents of which are incorporated herein by reference.

FIELD

Embodiments described herein relate to a semiconductor device and a method of manufacturing the same.

BACKGROUND

When a block insulator is to be formed in a memory hole, a shape of the memory hole may be an undesired shape. For example, when a convex portion is present on a side face of the memory hole, the convex portion may cause electric field concentration.

BRIEF DESCRIPTION OF THE DRAWINGS

FIGS. 10A to 11C are sectional views illustrating the method of manufacturing the semiconductor device of the first embodiment;

FIGS. 15A to 15C are sectional views illustrating a method of manufacturing a semiconductor device of the second embodiment; and FIGS. 16A to 16C are sectional views illustrating a method of manufacturing a semiconductor device of a modification of the second embodiment.

DETAILED DESCRIPTION

Figure 1:
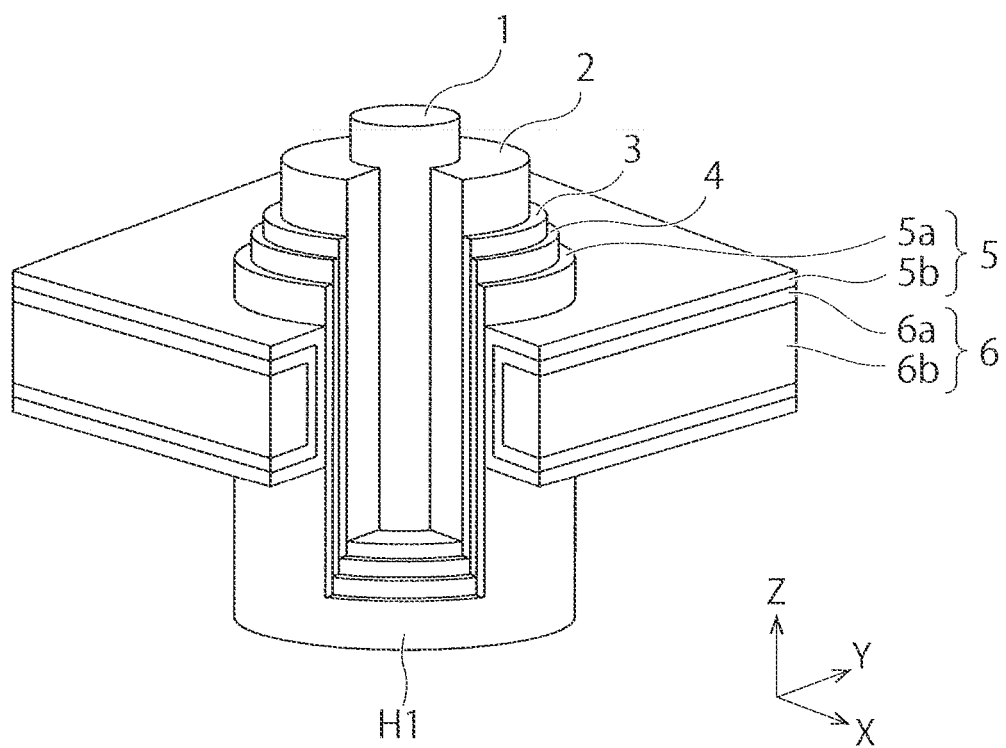
FIG. 1 is a perspective view illustrating a structure of a semiconductor device of a first embodiment.

Embodiments will now be explained with reference to the accompanying drawings. In FIGS. 1 to 16C, same reference characters are applied to same configurations and redundant explanations are omitted.

In one embodiment, a method of manufacturing a semiconductor device includes forming a stacked film alternately including a plurality of first layers and a plurality of second layers in a first direction, forming a hole extending in the first direction in the stacked film, and forming a first insulator on a side face of the stacked film in the hole. The method further includes removing the first insulator in the hole to expose a first part of the side face of the stacked film at a predetermined height in the first direction of the hole and to expose a side face of the first insulator remaining on a second part of the side face of the stacked film at the predetermined height. The method further includes forming a second insulator on the first part of the side face of the stacked film and the side face of the remaining first insulator in the hole, forming a charge storage layer on a side face of the second insulator in the hole, forming a third insulator on a side face of the charge storage layer in the hole, and forming a semiconductor layer on a side face of the third insulator in the hole.

First Embodiment

FIG. 1 is a perspective view illustrating a structure of the semiconductor device of the first embodiment. The semiconductor device in FIG. 1 is a three-dimensional type NAND memory, for example.

The semiconductor device in FIG. 1 includes a core insulator 1, a channel semiconductor layer 2, a tunnel insulator 3, a charge storage layer 4, a block insulator 5 and an electrode layer 6. The block insulator includes an insulator 5a and an insulator 5b. The electrode layer 6 includes a barrier metal layer 6a and an electrode material layer 6b. The insulator 5a is an example of the first, second and fourth insulators. The tunnel insulator 3 is an example of the third insulator.

In FIG. 1, a plurality of electrode layers and a plurality of insulating layers are alternately stacked on a substrate, and a memory hole H1 is provided in the electrode layers and the insulating layers. FIG. 1 illustrates one electrode layer 6 of the electrode layers. The electrode layers function as a word line of the NAND memory, for example. FIG. 1 illustrates an X direction and a Y direction that are parallel to a surface of the substrate and vertical to each other and a Z direction that is vertical to the surface of the substrate. In the present description, a +Z direction is considered as an upward direction and a −Z direction is considered as a downward direction. The −Z direction may coincide with a gravity direction or may not coincide with the gravity direction. The Z direction is an example of the first direction.

The core insulator 1, the channel semiconductor layer 2, the tunnel insulator 3, the charge storage layer 4 and the insulator 5a are formed in the memory hole H1 and constitute a memory cell of the NAND memory. The insulator 5a is formed on the surface of the electrode layers and the insulating layers in the memory hole H1, and the charge storage layer 4 is formed on the surface of the insulator 5a. The charge storage layer 4 can store charges between an outer peripheral side face and an inner peripheral side face. The tunnel insulator 3 is formed on the surface of the charge storage layer 4, and the channel semiconductor layer 2 is formed on the surface of the tunnel insulator 3. The channel semiconductor layer 2 functions as a channel of the memory cell. The core insulator 1 is formed in the channel semiconductor layer 2.

The insulator 5a is a $SiO_2$ film (silicon oxide film) for example. The charge storage layer 4 is a SiN film (silicon nitride film) for example. The tunnel insulator 3 is a $SiO_2$ film or a SiON film (silicon oxynitride film) for example. The channel semiconductor layer 2 is a polysilicon layer for example. The core insulator 1 is a SiO₂ film for example.

The insulator 5b, the barrier metal layer 6a and the electrode material layer 6b are formed between the insulating layers adjacent to each other, and are formed in order on a lower surface of the insulating layer on an upper side, an upper surface of the insulating layer on a lower side and a side face of the insulator 5a. The insulator 5b is a metal insulator such as an $Al_2O_3$ film (aluminum oxide film) for example. The barrier metal layer 6a is a TiN film (titanium nitride film) for example. The electrode material layer 6b is a W (tungsten) layer for example.

FIGS. 2 to 5 are sectional views illustrating a method of manufacturing the semiconductor device of the first embodiment.

Figure 2:
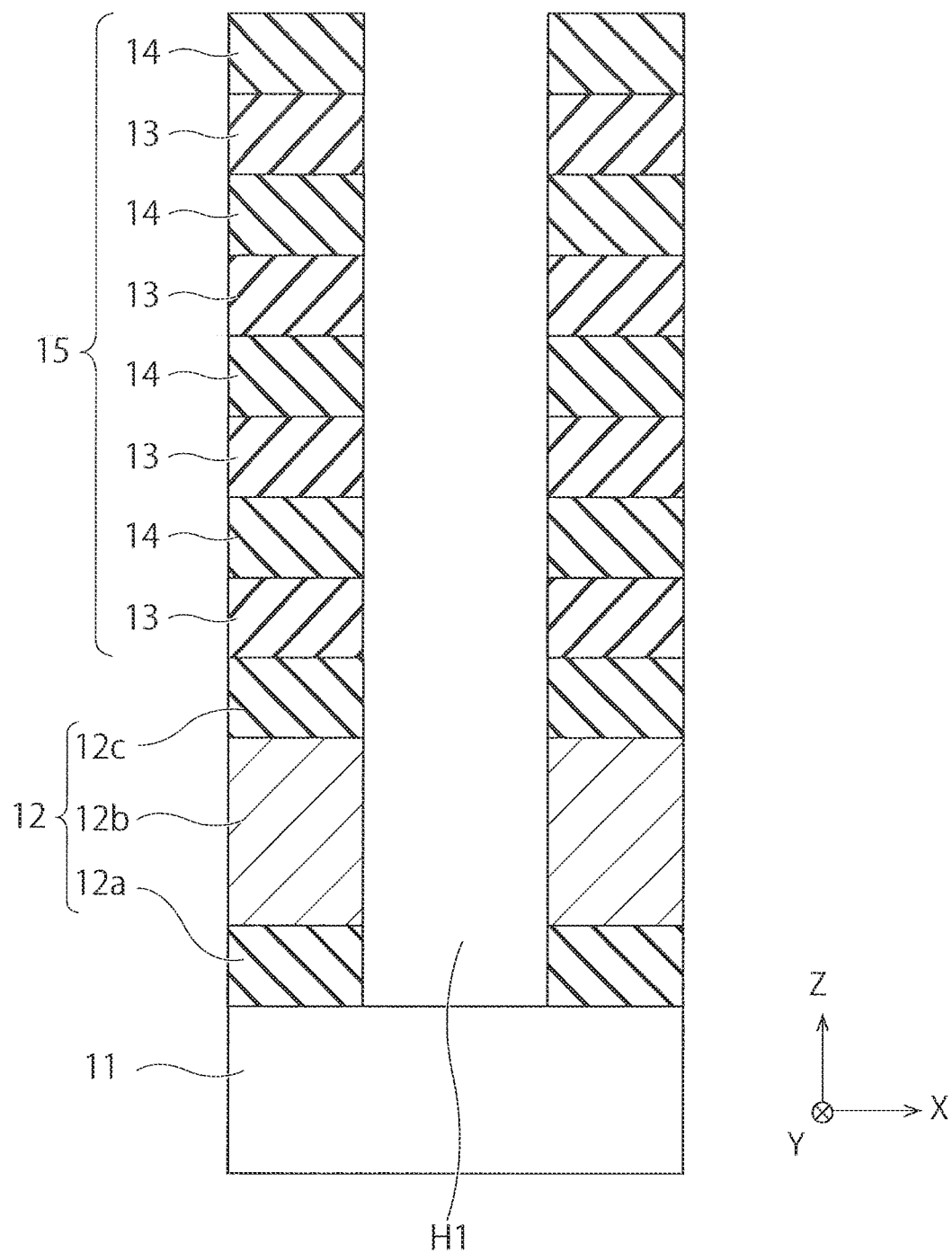
FIGS. 2 to 5 are sectional views illustrating a method of manufacturing the semiconductor device of the first embodiment.

First, a base layer 12 is formed on a substrate 11, and a plurality of sacrifice layers 13 and a plurality of insulating layers 14 are alternately formed on the base layer 12 (FIG. 2). As a result, on the base layer 12, a stacked film 15 alternately including the plurality of sacrifice layers 13 and the plurality of insulating layers 14 in the Z direction is formed. Then, the memory hole H1 passing through the stacked film 15 and the base layer 12 in the Z direction is formed (FIG. 2). As a result, an upper surface of the substrate 11 is exposed in the memory hole H1. The sacrifice layers 13 are examples of the first layers. The insulating layers 14 are examples of the second layers.

The substrate 11 is a semiconductor substrate such as a Si (silicon) substrate, for example. The base layer 12 is a stacked film including a lower insulator 12a, a semiconductor layer 12b and an upper insulator 12c provided in order on the substrate 11, for example. The lower insulator 12a is a $SiO_2$ film or a stacked film including a $SiO_2$ film and the other insulator, for example. The semiconductor layer 12b is a polysilicon layer for example. The upper insulator 12c is a $SiO_2$ film or a stacked film including a $SiO_2$ film and the other insulator, for example. The sacrifice layers 13 are SiN films for example. The insulating layers 14 are $SiO_2$ films for example. The memory hole H1 may be formed to reach the semiconductor layer above the substrate 11 instead of being formed to reach the substrate 11.

Figure 3:
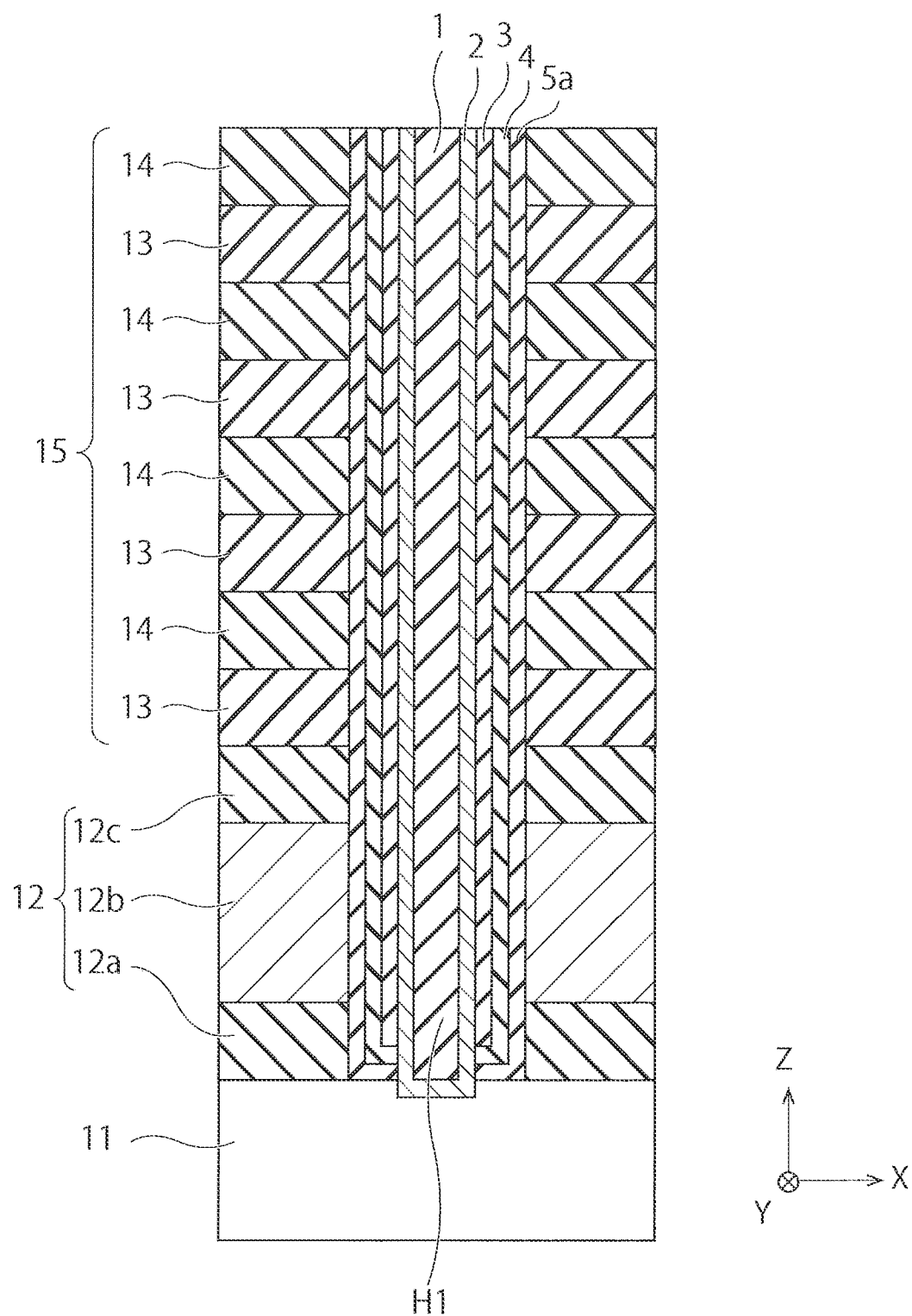

Next, on the surface of the substrate 11, the base layer 12 and the stacked film 15 in the memory hole H1, the insulator 5a, the charge storage layer 4 and the tunnel insulator 3 are formed in order (FIG. 3). Then, from a bottom portion of the memory hole H1, the insulator 5a, the charge storage layer 4 and the tunnel insulator 3 are removed by etching (FIG. 3). As a result, the upper surface of the substrate 11 is exposed again in the memory hole H1. Then, on the surface of the substrate 11 and the tunnel insulator 3 in the memory hole H1, the channel semiconductor layer 2 and the core insulator 1 are formed in order (FIG. 3). As a result, on the side face of the base layer 12 and the stacked film 15 in the memory hole H1, the insulator 5a, the charge storage layer 4, the tunnel insulator 3, the channel semiconductor layer 2 and the core insulator 1 are formed in order.

Figure 4:
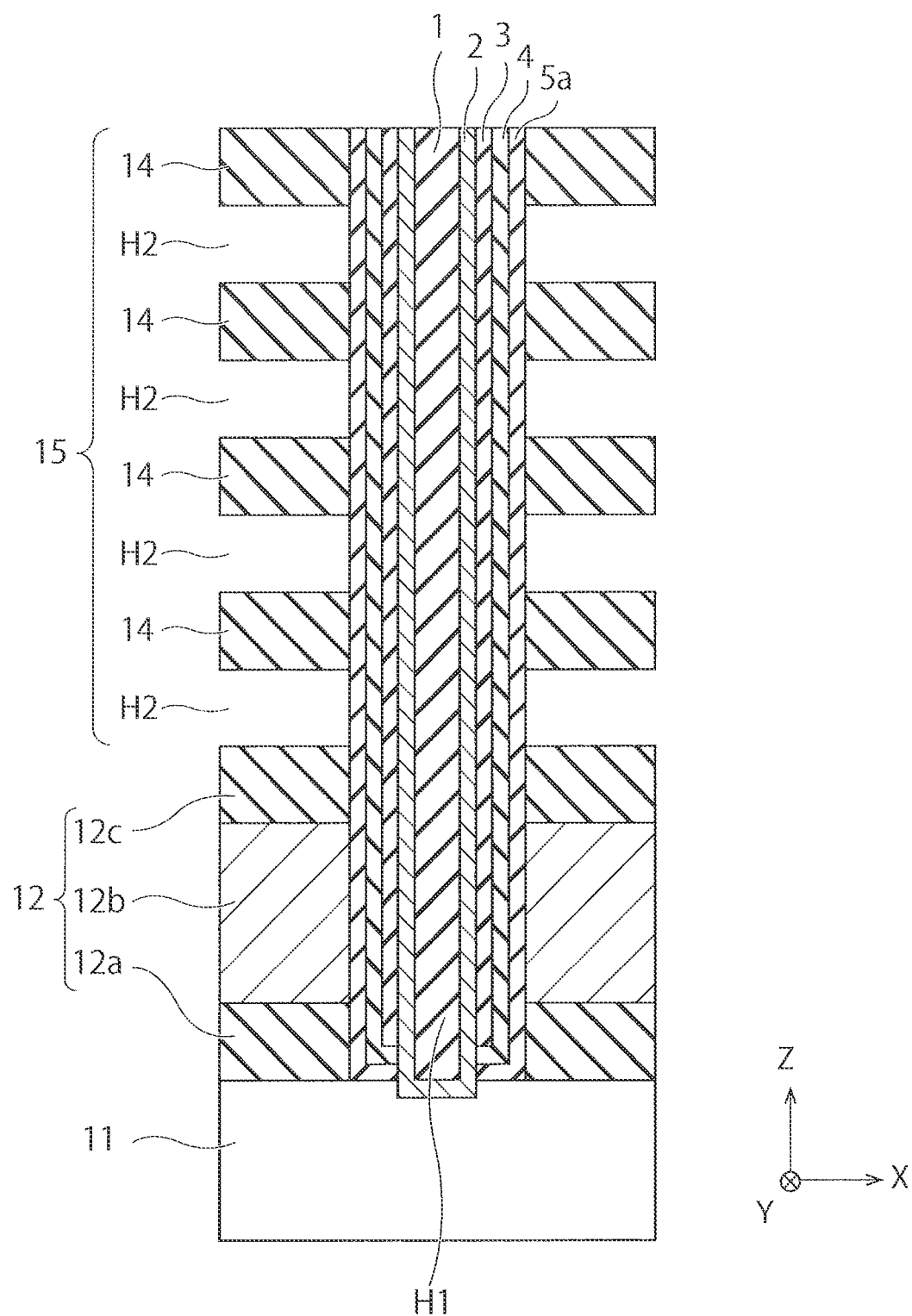

Next, an unillustrated slit is formed in the stacked film 15, and the sacrifice layers 13 are removed by a liquid chemical such as phosphoric acid by utilizing the slit. As a result, a plurality of cavities H2 are formed between the insulating layers 14 (FIG. 4).

Figure 5:
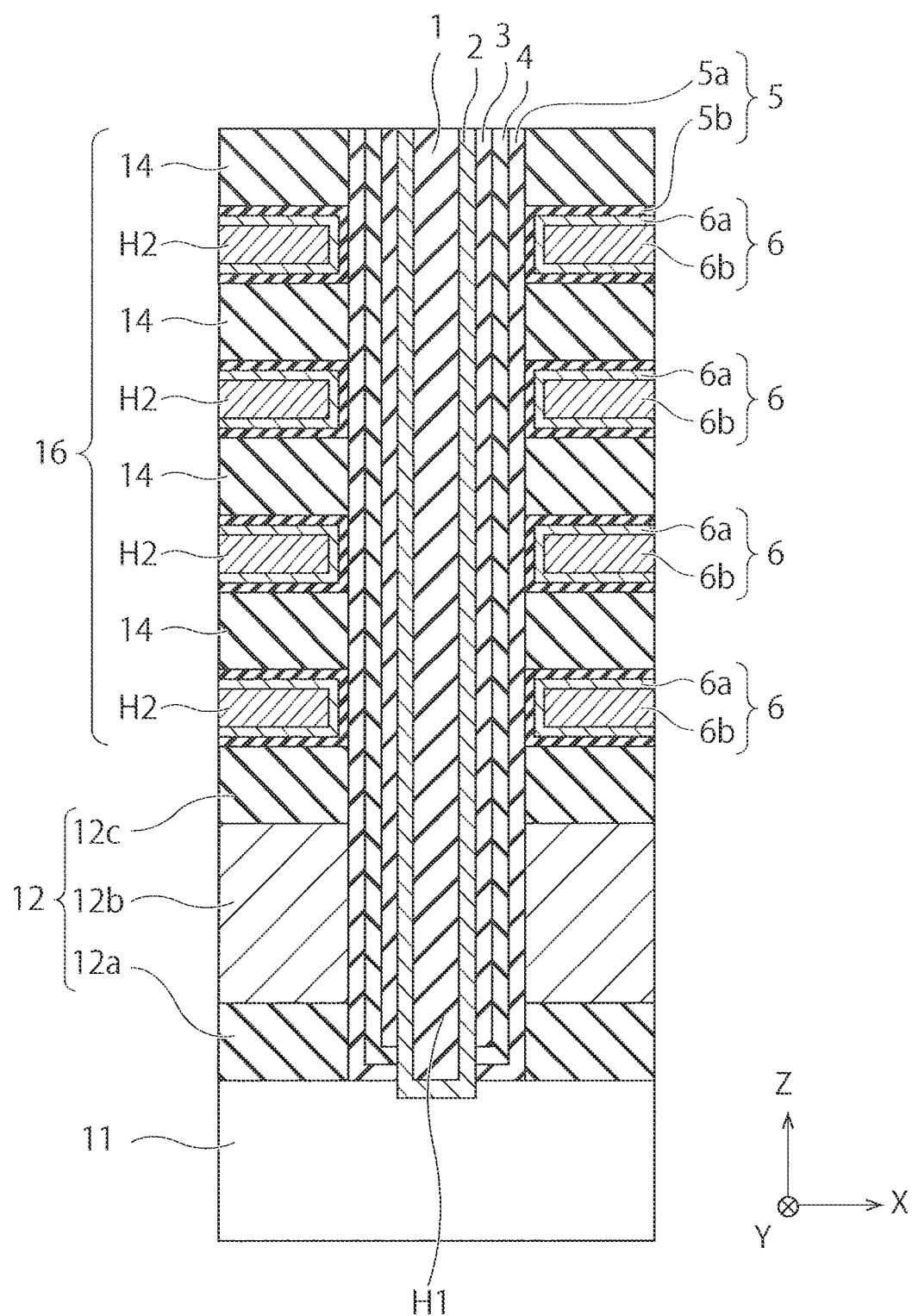

Then, on the surface of the insulating layers 14 and the insulator 5a in the cavities H2, the insulator 5b, the barrier metal layer 6a and the electrode material layer 6b are formed in order (FIG. 5). As a result, the block insulator 5 including the insulator 5a and the insulator 5b is formed. Further, in each cavity H2, the electrode layer 6 including the barrier metal layer 6a and the electrode material layer 6b is formed. In such a manner, the plurality of sacrifice layers 13 are replaced with the plurality of electrode layers 6, and a stacked film 16 alternately including the plurality of electrode layers 6 and the plurality of insulating layers 14 is formed on the base layer 12. The electrode layers 6 are separated from each other in the Z direction.

In such a manner, the semiconductor device of the present embodiment is manufactured (FIG. 5). FIG. 1 illustrates a portion of the semiconductor device illustrated in FIG. 5.

Next, first and second comparative examples of the present embodiment will be explained, and further details of the present embodiment will be explained thereafter.

Figure 6B:
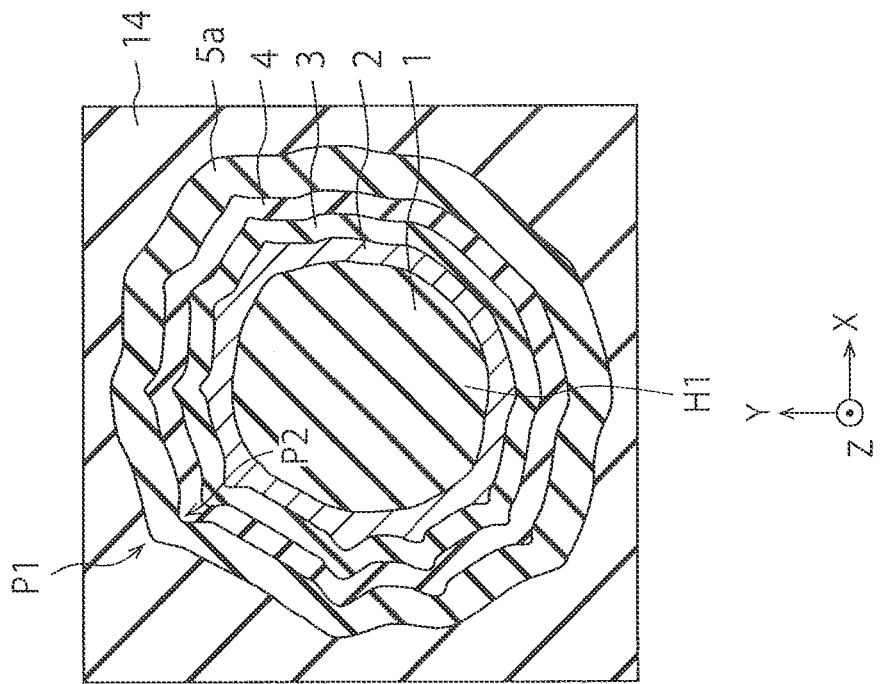
FIGS. 6A and 6B are sectional views illustrating a method of manufacturing a semiconductor device of a first comparative example of the first embodiment.
Figure 6A:
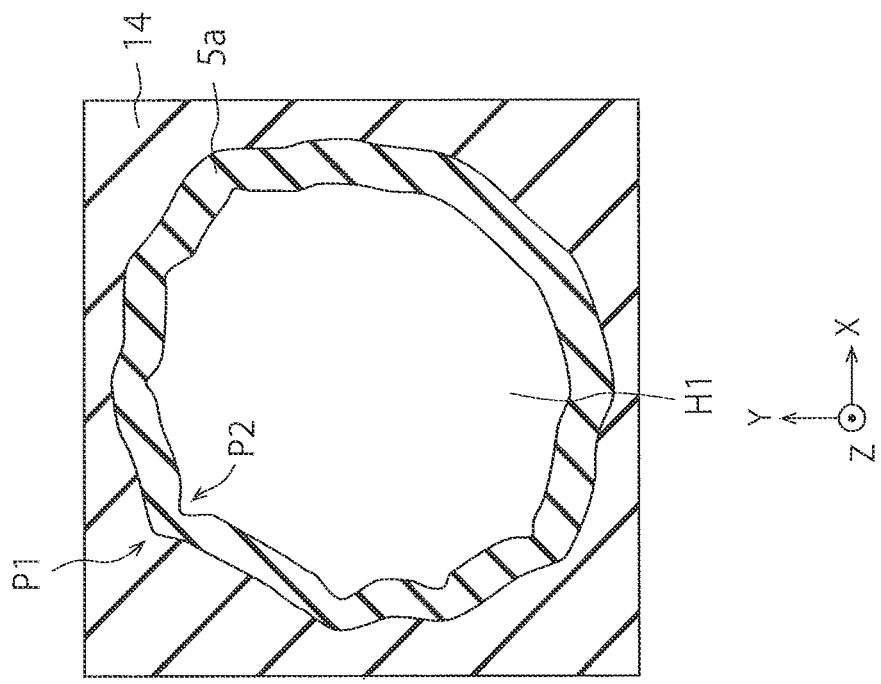

FIGS. 6A and 6B are sectional views illustrating a method of manufacturing a semiconductor device of the first comparative example of the first embodiment.

FIGS. 6A and 6B illustrate a process of forming the insulator 5a, the charge storage layer 4, the tunnel insulator 3, the channel semiconductor layer 2 and the core insulator 1 in the memory hole H1, similarly to FIG. 3. Specifically, FIG. 6A illustrates the process of forming the insulator 5a in the memory hole H1, and FIG. 6B illustrates the process thereafter. FIGS. 6A and 6B illustrate an XY section (cross section) of the memory hole H1. The XY section is positioned above a lower end of the memory hole H1 and below an upper end of the memory hole H1.

The memory hole H1 of the present comparative example is formed with an intention of making a shape of the XY section of the memory hole H1 circle. However, the shape of the XY section of the memory hole H1 of the present comparative example may become a distorted shape, that is the shape greatly different from a circle, due to some reasons when forming the memory hole H1. For example, when forming the plurality of memory holes H1 in the stacked film 15, the shape of the XY section of one memory hole H1 may be distorted. In addition, the shape of one memory hole H1 may be distorted on one certain XY section. The distorted XY section tends to appear on the XY section near the lower surface of the stacked film 15 in each memory hole H1.

When a sectional shape of the memory hole H1 is distorted, as illustrated in FIG. 6A, a convex portion projected in a convex shape in a radial direction may appear on the side face of the memory hole H1. FIG. 6A illustrates an outer peripheral side face P1 and an inner peripheral side face P2 of the insulator 5a at the convex portion. Due to the effect of the convex portion of the memory hole H1, the outer peripheral side face P1 is in the convex shape and the inner peripheral side face P2 is also in the convex shape. This further affects the shapes of the charge storage layer 4, the tunnel insulator 3 and the channel semiconductor layer 2 as illustrated in FIG. 6B. The convex portion of the memory hole H1 is also referred to as a striation portion. Each striation portion of the memory hole H1 has a locally small curvature radius.

The insulator 5a of the present comparative example is a $SiO_2$ film formed by oxidation, for example. When the insulator 5a is formed at the convex portion of the memory hole H1, a thickness of the insulator 5a becomes thin near the convex portion due to stress during the oxidation or the like. In this case, during use of the semiconductor device of the present comparative example, electric field concentration may occur at the insulator 5a near the convex portion. As a result, it is possible that the electric field concentration causes erroneous write to the memory cell. In addition, when the convex portion of the memory hole H1 causes film thickening or a break of the channel semiconductor layer 2, it is possible that a cell current is reduced or the like and performance of the memory cell is deteriorated.

Figure 7B:
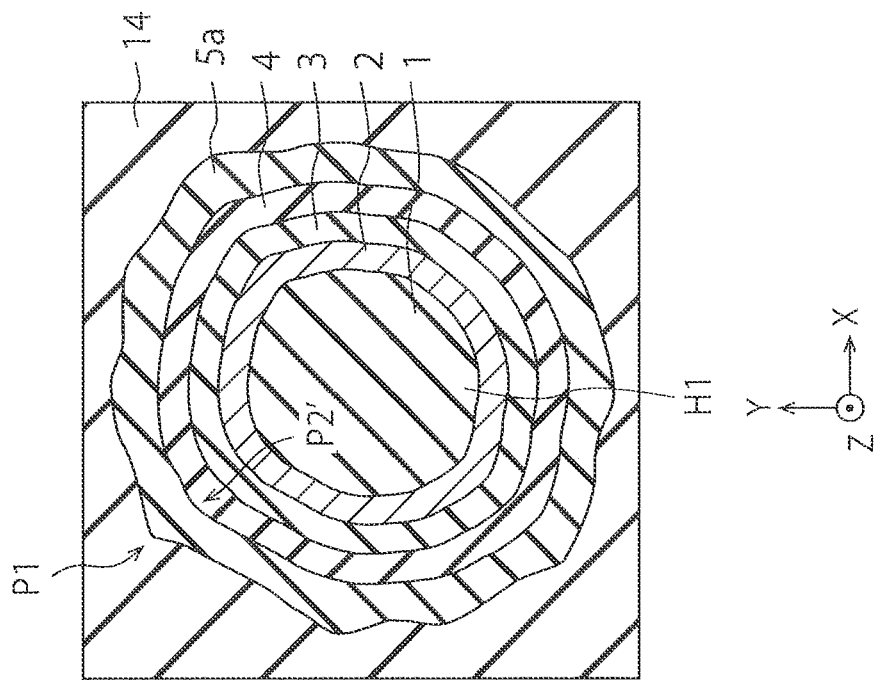
FIGS. 7A and 7B are sectional views illustrating a method of manufacturing a semiconductor device of a second comparative example of the first embodiment.
Figure 7A:
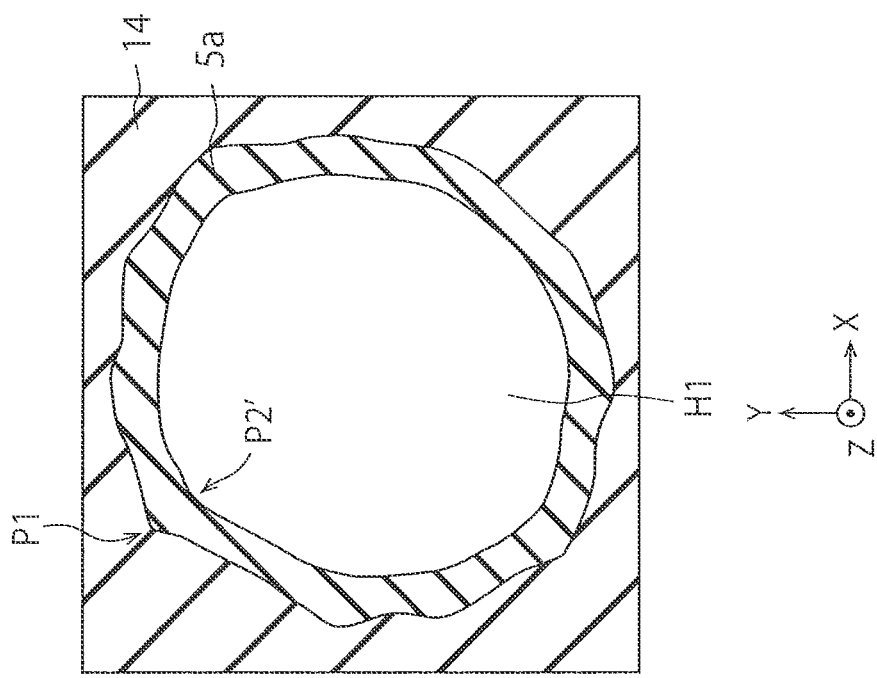

FIGS. 7A and 7B are sectional views illustrating a method of manufacturing a semiconductor device of the second comparative example of the first embodiment.

FIGS. 7A and 7B respectively correspond to FIGS. 6A and 6B. Accordingly, FIG. 7A illustrates the process of forming the insulator 5a in the memory hole H1, and FIG. 7B illustrates the process of forming the charge storage layer 4, the tunnel insulator 3, the channel semiconductor layer 2 and the core insulator 1 in the memory hole H1.

FIG. 7A illustrates the outer peripheral side face P1 and an inner peripheral side face P2' of the insulator 5a at the convex portion of the memory hole H1. The outer peripheral side face P1 of the present comparative example is in the convex shape due to the effect of the convex portion of the memory hole H1, similarly to the outer peripheral side face P1 of the first comparative example. On the other hand, the inner peripheral side face P2' of the present comparative example is in a smooth shape close to a circular shape differently from the inner peripheral side face P2 of the first comparative example. Such an inner peripheral side face P2' can be achieved by forming the insulator 5a by utilizing slimming as to be described later.

Figure 8B:
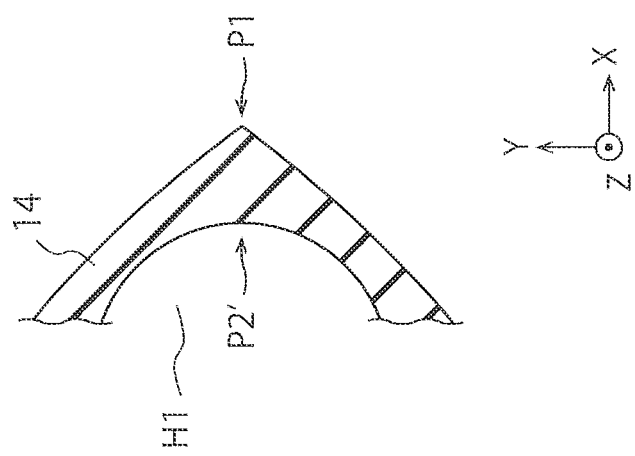
FIGS. 8A and 8B are sectional views for describing the methods of manufacturing the semiconductor devices of the first and second comparative examples of the first embodiment.
Figure 8A:
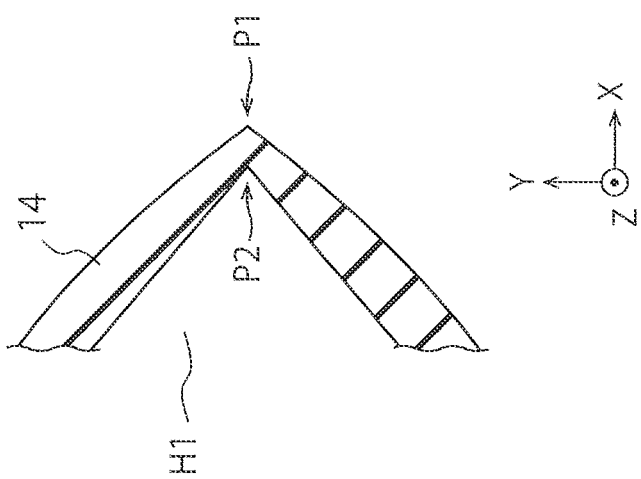

FIGS. 8A and 8B are sectional views for describing the methods of manufacturing the semiconductor devices of the first and second comparative examples of the first embodiment.

FIG. 8A illustrates the convex portion of the memory hole H1 of the first comparative example and the outer peripheral side face P1 and the inner peripheral side face P2 of the insulator 5a at the convex portion. Due to the effect of the convex portion of the memory hole H1, the outer peripheral side face P1 is in the convex shape and the inner peripheral side face P2 is also in the convex shape. As a result, the outer peripheral side face P1 and the inner peripheral side face P2 of the present comparative example have a locally small curvature radius. Further, the thickness of the insulator 5a of the present comparative example is thin near the convex portion. Accordingly, during use of the semiconductor device of the present comparative example, the electric field concentration may occur at the insulator 5a near the convex portion.

FIG. 8B illustrates the convex portion of the memory hole H1 of the second comparative example and the outer peripheral side face P1 and the inner peripheral side face P2' of the insulator 5a at the convex portion. Due to the effect of the convex portion of the memory hole H1, the outer peripheral side face P1 is in the convex shape. On the other hand, the inner peripheral side face P2' is in the smooth shape close to the circular shape. As a result, the curvature radius of the inner peripheral side face P2' of the present comparative example is larger than the curvature radius of the outer peripheral side face P1. Further, the thickness of the insulator 5a of the present comparative example is thick near the convex portion. This makes it possible to suppress occurrence of the electric field concentration at the insulator 5a near the convex portion during use of the semiconductor device of the present comparative example.

FIGS. 9A to 9D are sectional views illustrating the method of manufacturing the semiconductor device of the second comparative example of the first embodiment. Specifically, FIG. 9A to FIG. 9D illustrate details of the processes illustrated in FIGS. 7A and 7B.

Figure 9A:
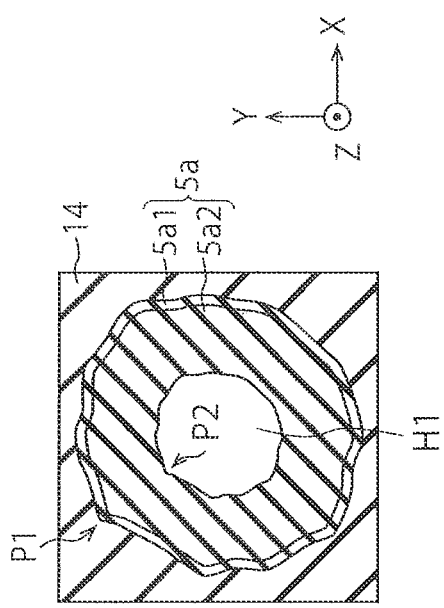
FIGS. 9A to 9D are sectional views illustrating the method of manufacturing the semiconductor device of the second comparative example of the first embodiment.

FIG. 9A illustrates the memory hole H1 formed to have the XY section in the distorted shape. First, an insulator 5a1 which is a portion of the insulator 5a is formed in the memory hole H1 (FIG. 9A). FIG. 9A illustrates the outer peripheral side face P1 of the insulator 5a (insulator 5a1) at the convex portion of the memory hole H1. The insulator 5a1 is a $SiO_2$ film formed by the oxidation, for example. The insulator 5a1 may be a $SiO_2$ film formed by deposition. The insulator 5a1 is an example of the first insulator.

Figure 9B:
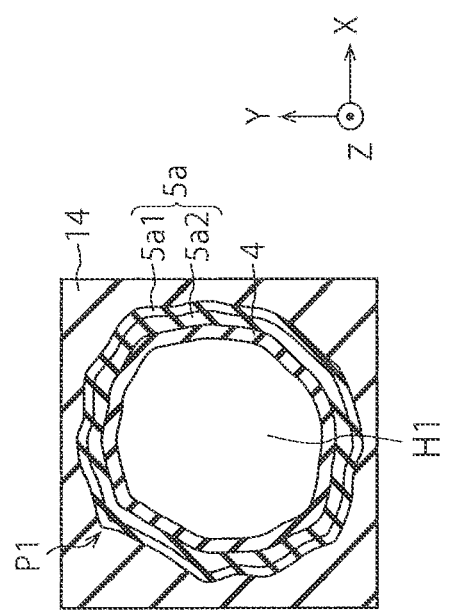

Next, an insulator 5a2 which is another portion of the insulator 5a is formed in the memory hole H1 (FIG. 9B). As a result, the insulator 5a2 is formed on the side face of the insulator 5a1 in the memory hole H1. FIG. 9B illustrates the inner peripheral side face P2 of the insulator 5a (insulator 5a2) at the convex portion of the memory hole H1. However, the inner peripheral side face P2 illustrates the side face before the slimming to be described later, and the inner peripheral side face P2' illustrates the side face after the slimming to be described later. The insulator 5a2 is a $SiO_2$ film formed by ALD (Atomic Layer Deposition) for example. The insulator 5a2 may be a $SiO_2$ film formed by the deposition other than the ALD. The insulator 5a2 is an example of the second insulator.

Figure 9C:
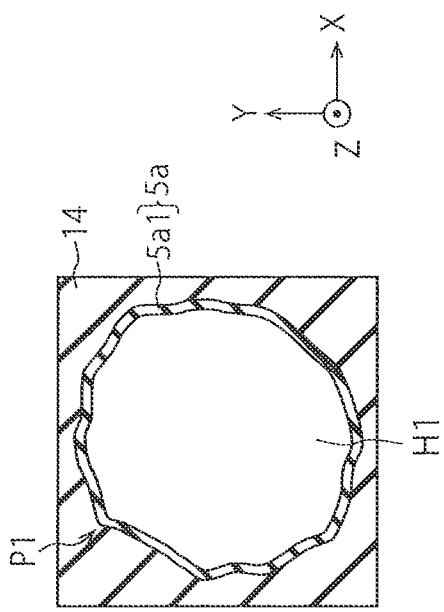

Then, the slimming of the insulator 5a2 is performed (FIG. 9C). Specifically, a liquid chemical to etch the insulator 5a2 is supplied into the memory hole H1. As a result, the insulator 5a2 is removed from the inner peripheral side face of the insulator 5a2 and the thickness of the insulator 5a2 becomes thin. Further, the inner peripheral side face P2' of the insulator 5a (insulator 5a2) at the convex portion of the memory hole H1 has the smooth shape close to the circular shape by the slimming. The liquid chemical is hot NC2, SC-1 or a dilute hydrofluoric acid aqueous solution, for example.

Figure 9D:
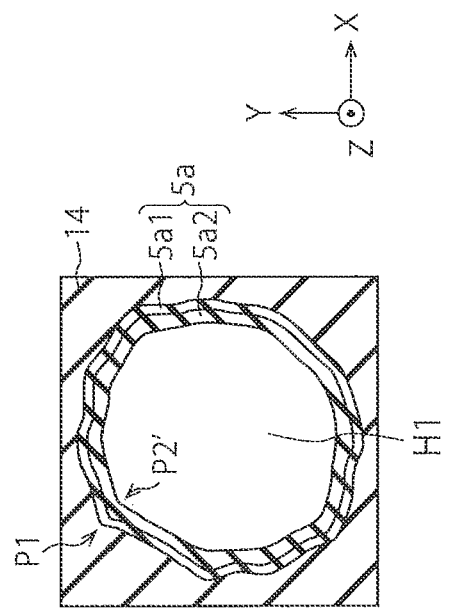

Next, the charge storage layer 4 is formed in the memory hole H1 (FIG. 9D). As a result, the charge storage layer 4 is formed on the side face of the insulator 5a2 in the memory hole H1. Thereafter, the tunnel insulator 3, the channel semiconductor layer 2 and the core insulator 1 are formed in order in the memory hole H1.

The present comparative example makes it possible to suppress the occurrence of the electric field concentration at the insulator 5a near the convex portion by making the shape of the inner peripheral side face P2' smooth. However, since a slimming amount of the insulator 5a2 is small in the present comparative example, it is highly possible that the sectional shape of the inner peripheral side face of the insulator 5a2 is distorted even after the slimming. Accordingly, the possibility that the thickness of the insulator 5a after the slimming becomes nonuniform and the possibility that the sectional shapes of the charge storage layer 4, the tunnel insulator 3 and the channel semiconductor layer 2 also become distorted are high.

FIGS. 10A to 11C are sectional views illustrating the method of manufacturing the semiconductor device of the first embodiment. Specifically, FIGS. 10A to 11C illustrate the details of the processes illustrated in FIGS. 2 and 3. FIGS. 10A to 11C illustrate the XY section (cross section) of the memory hole H1. The XY section is positioned above the lower end of the memory hole H1 and below the upper end of the memory hole H1. A height of the XY section is an example of the predetermined height.

First, by lithography and RIE (Reactive Ion Etching), the memory hole H1 is formed in the stacked film 15 and the base layer 12 illustrated in FIG. 2 (FIG. 10A). FIG. 10A illustrates the XY section of the insulating layer 14 included in the stacked film 15. The memory hole H1 of the present embodiment is formed with the intention of making the sectional shape of the memory hole H1 circle, similarly to the first and second comparative examples. However, the sectional shape of the memory hole H1 illustrated in FIG. 10A is the distorted shape, that is the shape greatly different from a circle, due to some reasons when forming the memory hole H1.

Next, the insulator 5a1 which is a portion of the insulator 5a is formed in the memory hole H1 (FIG. 10B). As a result, the insulator 5a1 is formed on the side face of the stacked film 15 and the base layer 12 in the memory hole H1. FIG. 10B illustrates the outer peripheral side face P1 and an inner peripheral side face P3 of the insulator 5a1 at the convex portion of the memory hole H1. However, the inner peripheral side face P3 illustrates the side face before the slimming to be described later, and an inner peripheral side face P3' (see FIG. 10C) illustrates the side face after the slimming to be described later. The insulator 5a1 is a $SiO_2$ film formed by the oxidation, for example. The insulator 5a1 may be a $SiO_2$ film formed by the deposition. The insulator 5a1 is an example of the first insulator.

Next, the slimming of the insulator 5a1 is performed (FIG. 10C). Specifically, the liquid chemical to etch the insulator 5a1 is supplied into the memory hole H1. As a result, the insulator 5a1 is removed from the inner peripheral side face of the insulator 5a1. The liquid chemical is the hot NC2, the SC-1 or the dilute hydrofluoric acid aqueous solution, for example.

The slimming is performed such that the insulator 5a1 remains on the side face of the stacked film 15 though the side face of the stacked film 15 is exposed in the memory hole H1. In FIG. 10C, the insulator 5a1 is removed from the side face of the insulating layer 14 and the side face of the insulating layer 14 is exposed in the memory hole H1, but the insulator 5a1 is still present on the side face of the insulating layer 14. In other words, a part (as an example of a first part) of the side face of the insulating layer 14 is exposed, and the side face of the insulator 5a1 remaining on the other part (as an example of a second part) of the side face of the insulating layer 14 is exposed. As a result of the slimming, the inner peripheral side face P3' of the insulator 5a1 at the convex portion of the memory hole H1 has the smooth shape close to the circular shape. Accordingly, the curvature radius of the inner peripheral side face P3' of the present embodiment is larger than the curvature radius of the outer peripheral side face P1.

In the present embodiment, since the slimming of the insulator 5a1 is performed until the side face of the stacked film 15 is exposed, the slimming amount of the insulator 5a1 becomes large. Accordingly, the sectional shape of the memory hole H1 illustrated in FIG. 10C, that is the sectional shape of the memory hole H1 corrected by the insulator 5a1, is a circle. In such a manner, the present embodiment makes it possible to dissolve distortion of the sectional shape of the memory hole H1 and bring the sectional shape of the memory hole H1 closer to a circle. This makes it possible to, as to be described later, roughly uniformize the thickness of the insulator 5a including the insulator 5a1 and the insulator 5a2 (see FIG. 11A) and to also bring the sectional shapes of the charge storage layer 4, the tunnel insulator 3 and the channel semiconductor layer 2 closer to a circle (see FIG. 11C).

In addition, the slimming in the present embodiment is performed such that the insulator 5a1 remains on the side face of the stacked film 15. When the slimming is performed such that the insulator 5a1 does not remain on the side face of the stacked film 15, a diameter of the memory hole H1 becomes large and there is a risk that the different memory holes H1 in the semiconductor device are brought into contact. On the other hand, when a distance between the memory holes H1 is set to be large in order to avoid the contact of the memory holes H1 with each other, there is a risk that an integration degree of the semiconductor device declines. The present embodiment makes it possible to solve the problems by performing the slimming such that the insulator 5a1 remains on the side face of the stacked film 15.

Figure 11A:
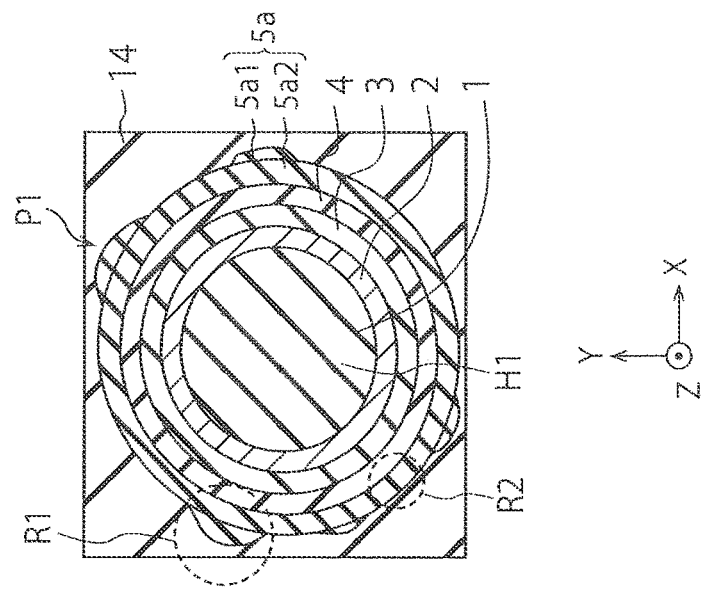

Next, the insulator 5a2 which is another portion of the insulator 5a is formed in the memory hole H1 (FIG. 11A). As a result, the insulator 5a2 is formed on the side face of the stacked film 15, the base layer 12 and the insulator 5a1 in the memory hole H1. FIG. 11A illustrates the inner peripheral side face P2 of the insulator 5a2 at the convex portion of the memory hole H1. The insulator 5a2 is a $SiO_2$ film formed by the ALD, for example. The insulator 5a2 may be a $SiO_2$ film formed by the deposition other than the ALD. The insulator 5a2 is an example of the second insulator. The insulator 5a2 in FIG. 11A is formed on the above-mentioned first part of the side face of the insulating layer 14.

In such a manner, the insulator 5a including the insulator 5a1 and the insulator 5a2 is formed on the side face of the stacked film 15 and the base layer 12. As illustrated in FIG. 11A, the insulator 5a1 of the present embodiment remains at the convex portion of the memory hole H1 so that it has the shape projected in the convex shape in the radial direction from the outer peripheral side face of the insulator 5a2 that faces the inner peripheral side face P3' of the insulator 5a1. In the present embodiment, since the inner peripheral side face P3' of the insulator 5a1 is in the smooth shape, the inner peripheral side face P2 of the insulator 5a2 is also in the smooth shape. In the present embodiment, the slimming of the insulator 5a2 may be performed similarly to the second comparative example or the slimming of the insulator 5a2 may not be performed. The insulator 5a is an example of the fourth insulator.

Figure 11B:
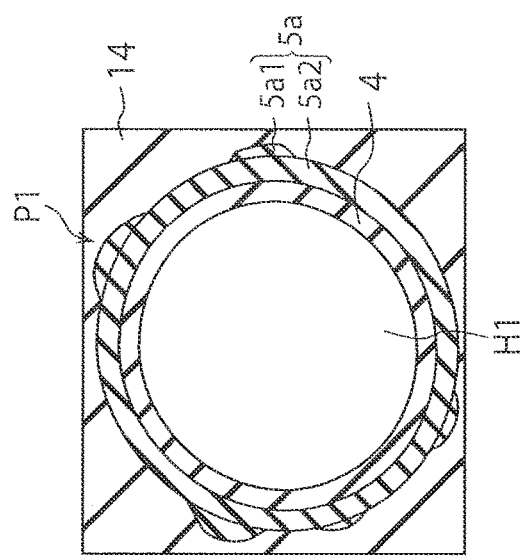
Figure 11C:
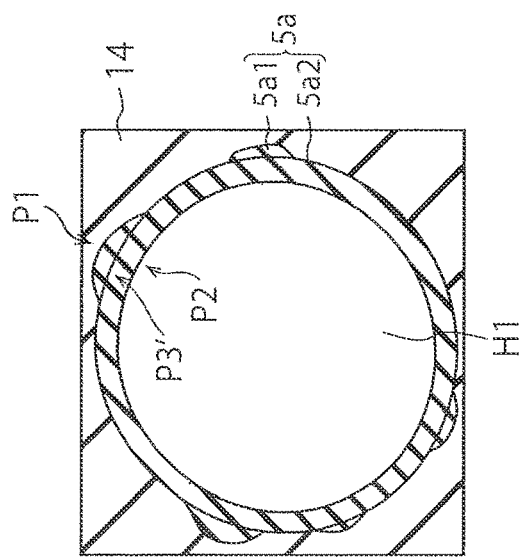

Next, the charge storage layer 4, the tunnel insulator 3, the channel semiconductor layer 2 and the core insulator 1 are formed in order in the memory hole H1 (FIGS. 11B and 11C). As a result, on the side face of the insulator 5a2 in the memory hole H1, the charge storage layer 4, the tunnel insulator 3, the channel semiconductor layer 2 and the core insulator 1 are formed in order. The tunnel insulator 3 is an example of the third insulator.

FIG. 11C illustrates regions R1 and R2 of the insulator 5a. The region R1 includes the insulator 5a1 and the insulator 5a2. The region R2 includes only the insulator 5a2 out of the insulator 5a1 and the insulator 5a2. In the present embodiment, since the slimming of the insulator 5a1 is performed until the side face of the stacked film 15 is exposed in the process illustrated in FIG. 10C, the insulator 5a is formed so as to include the regions R1 and R2. In the insulator 5a of the present embodiment, the thickness of the insulator 5a in the region R1 is thicker than the thickness of the insulator 5a in the region R2. The thickness of the insulator 5a in the region R1 is the total thickness of the insulator 5a1 and the insulator 5a2, and the thickness of the insulator 5a in the region R2 is the thickness of the insulator 5a2 only.

In the process illustrated in FIG. 10C, the sectional shape of the memory hole H1 is corrected to be a circle by the insulator 5a1. Accordingly, the sectional shapes of the side face of the insulator 5a2, the charge storage layer 4, the tunnel insulator 3 and the channel semiconductor layer 2 illustrated in FIG. 11C are also a circle. As a result, the thickness of each of the insulator 5a2, the charge storage layer 4, the tunnel insulator 3 and the channel semiconductor layer 2 is uniform. In addition, the thickness of the insulator 5a including the insulator 5a1 and the insulator 5a2 is nonuniform at the portion of the insulator 5a1 but is uniform at the other portion.

The slimming of the insulator 5a1 may be performed using the liquid chemical other than the hot NC2, the SC-1 and the dilute hydrofluoric acid aqueous solution. Since the slimming etches not only the insulator 5a1 ($SiO_2$ film) but also the sacrifice layers 13 (SiN film) and the insulating layers 14 ($SiO_2$ film) in the stacked film 15, it is desirable to perform the slimming using the liquid chemical with which etch selectivity of the SiN film and the $SiO_2$ film is close to 1.

In addition, the insulator 5a1 may be the $SiO_2$ film formed by the oxidation or may be the $SiO_2$ film formed by the deposition. For example, the insulator 5a1 may be formed by depositing the $SiO_2$ film. Further, the insulator 5a1 may be formed by depositing the SiN film and changing the SiN film to the $SiO_2$ film by the oxidation.

In addition, the insulator 5a1 and the insulator 5a2 are the same insulator ($SiO_2$ film) in the present embodiment but may be insulators different from each other. Further, the insulator 5a1 is the same insulator ($SiO_2$ film) as the insulating layers 14 in the present embodiment, but may be the same insulator (SiN film) as the sacrifice layers 13 or may be the insulator different from both of the insulating layers 14 and the sacrifice layers 13. The insulator 5a1 may be a SiON film or may be a high-k insulator such as an aluminum oxide film, a hafnium oxide film and a zirconium oxide film, for example.

Figure 12C:
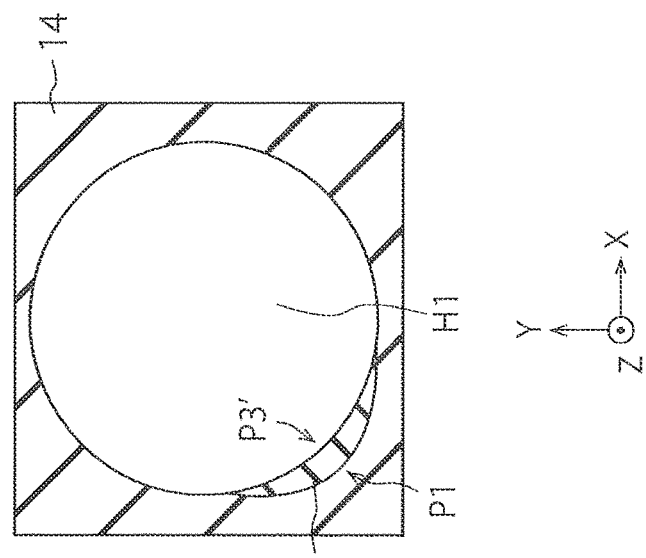
FIGS. 12A to 12C are sectional views illustrating a method of manufacturing a semiconductor device of a first modification of the first embodiment.
Figure 12B:
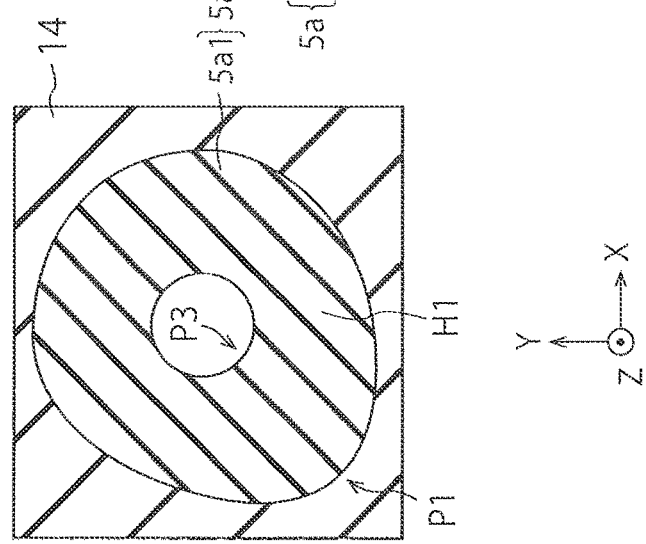
Figure 12A:
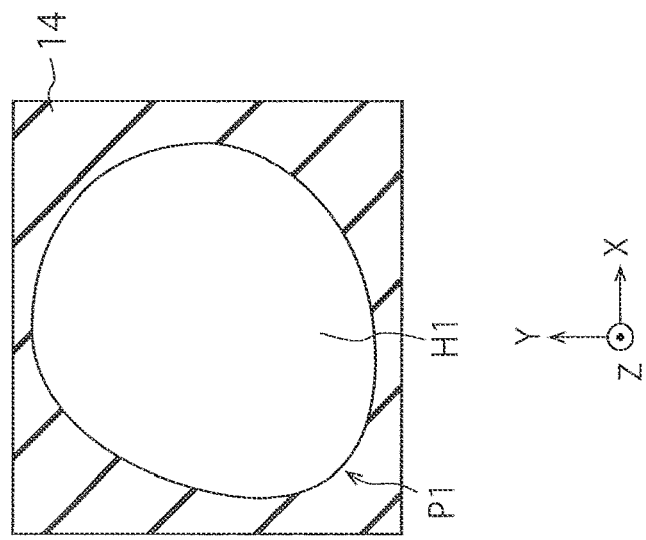

FIGS. 12A to 12C are sectional views illustrating a method of manufacturing a semiconductor device of a first modification of the first embodiment. FIGS. 12A to 12C respectively correspond to FIG. 10A to 10C.

First, the memory hole H1 is formed in the stacked film 15 and the base layer 12 illustrated in FIG. 2 by the lithography and the RIE (FIG. 12A). While the sectional shape of the memory hole H1 illustrated in FIG. 10A is processed into the distorted shape, the sectional shape of the memory hole H1 illustrated in FIG. 12A is processed into a shape close to an ellipse. The cross section illustrated in FIG. 10A and the cross section illustrated in FIG. 12A are the different XY sections of the same memory hole H1. For example, the cross section illustrated in FIG. 10A is the XY section of the memory hole H1 near the lower surface of the stacked film 15, and the cross section illustrated in FIG. 12A is the XY section of the memory hole H1 near the upper surface of the stacked film 15.

Next, the insulator 5a1 which is a portion of the insulator 5a is formed in the memory hole H1 (FIG. 12B). As a result, the insulator 5a1 is formed on the side face of the stacked film 15 and the base layer 12 in the memory hole H1. FIG. 12B illustrates the outer peripheral side face P1 and the inner peripheral side face P3 of the insulator 5a1 at the convex portion of the memory hole H1. However, the inner peripheral side face P3 illustrates the side face before the slimming to be described later, and the inner peripheral side face P3' (see FIG. 12C) illustrates the side face after the slimming to be described later.

Then, the slimming of the insulator 5a1 is performed (FIG. 12C). Specifically, the liquid chemical to etch the insulator 5a1 is supplied into the memory hole H1. As a result, the insulator 5a1 is removed from the inner peripheral side face of the insulator 5a1. The slimming is performed such that the insulator 5a1 remains on the side face of the stacked film 15 though the side face of the stacked film 15 is exposed in the memory hole H1. As a result, the inner peripheral side face P3' of the insulator 5a1 at the convex portion of the memory hole H1 has the smooth shape close to the circular shape. The sectional shape of the memory hole H1 illustrated in FIG. 12C, that is the sectional shape of the memory hole H1 corrected by the insulator 5a1, is a circle.

In such a manner, the slimming in the present embodiment makes it possible to correct various sectional shapes of the memory hole H1 to be a circle.

Figure 13C:
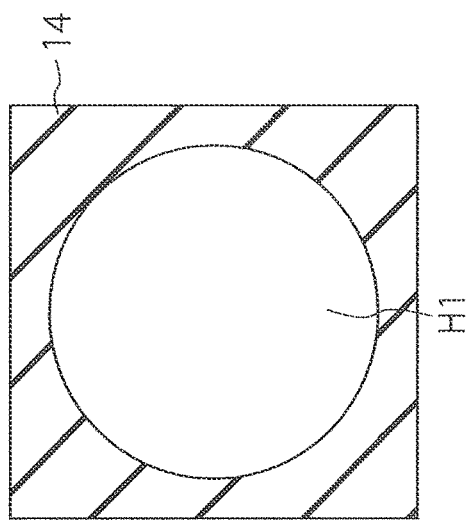
FIGS. 13A to 13C are sectional views illustrating a method of manufacturing a semiconductor device of a second modification of the first embodiment.
Figure 13B:
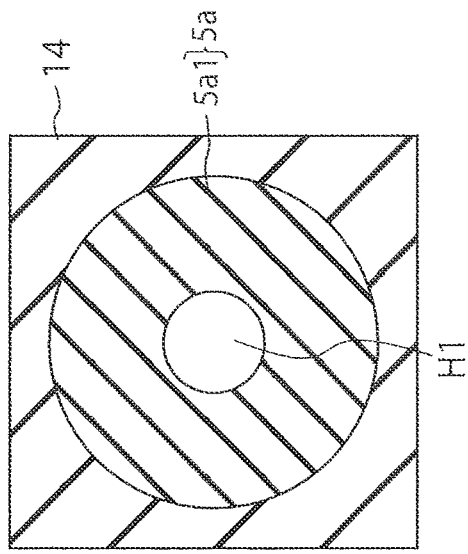
Figure 13A:
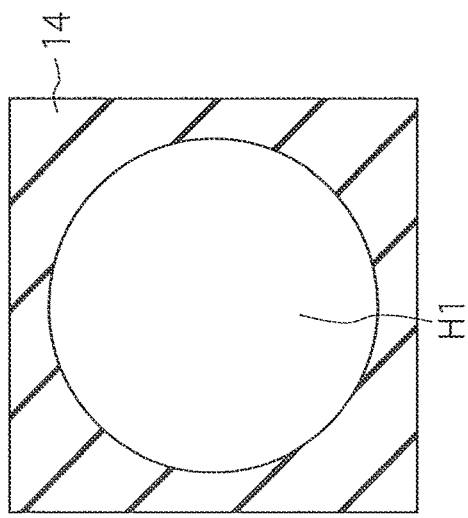

FIGS. 13A to 13C are sectional views illustrating a method of manufacturing a semiconductor device of a second modification of the first embodiment. FIGS. 13A to 13C respectively correspond to FIGS. 10A to 10C.

First, the memory hole H1 is formed in the stacked film 15 and the base layer 12 illustrated in FIG. 2 by the lithography and the RIE (FIG. 13A). While the sectional shape of the memory hole H1 illustrated in FIG. 10A is processed into the distorted shape, the sectional shape of the memory hole H1 illustrated in FIG. 13A is processed into a shape close to a circle. The cross section illustrated in FIG. 10A and the cross section illustrated in FIG. 13A are the different XY sections of the same memory hole H1.

Next, the insulator 5a1 which is a portion of the insulator 5a is formed in the memory hole H1 (FIG. 13B). As a result, the insulator 5a1 is formed on the side face of the stacked film 15 and the base layer 12 in the memory hole H1. Since the sectional shape of the memory hole H1 illustrated in FIG. 13A is a circle, the sectional shape of the inner peripheral side face of the insulator 5a illustrated in FIG. 13B is also a circle.

Then, the slimming of the insulator 5a1 is performed (FIG. 13C). Specifically, the liquid chemical to etch the insulator 5a1 is supplied into the memory hole H1. As a result, the insulator 5a1 is removed from the inner peripheral side face of the insulator 5a1. In FIG. 13C, the side face of the stacked film 15 is exposed in the memory hole H1 and the insulator 5a1 does not remain on the side face of the stacked film 15. In such a manner, the memory hole H1 may be processed so as to include the XY section (see FIG. 10C) where the insulator 5a1 remains and the XY section (see FIG. 13C) where the insulator 5a1 does not remain. Conversely, in FIG. 13C, the side face of the stacked film 15 may not be exposed in the memory hole H1 and the insulator 5a1 may remain on the side face of the stacked film 15.

As above, the insulator 5a of the present embodiment is formed by forming the insulator 5a1 on the side face of the memory hole H1, removing the insulator 5a1 such that the side face of the memory hole H1 is exposed and the insulator 5a1 remains, and forming the insulator 5a2 thereafter. Accordingly, the present embodiment makes it possible to form the memory hole H1 having desired characteristics by being able to suppress the electric field concentration onto the convex portion of the memory hole H1 and correct the sectional shape of the memory hole H1 to be a circle or the like.

Second Embodiment

Figure 14:
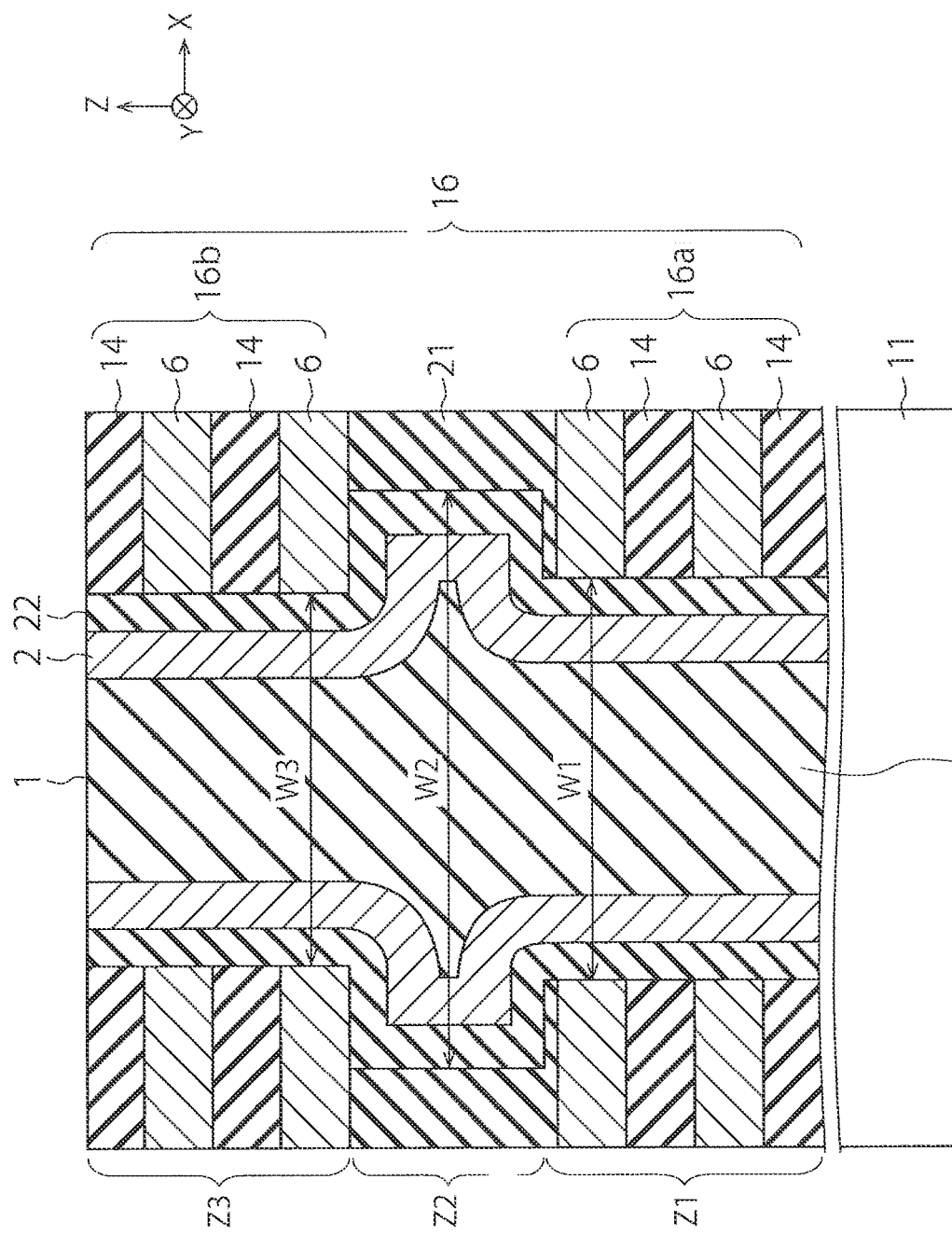
FIG. 14 is a sectional view illustrating a structure of a semiconductor device of a second embodiment.

FIG. 14 is a sectional view illustrating a structure of a semiconductor device of the second embodiment.

The semiconductor device in FIG. 14 has the structure similar to the structure illustrated in FIG. 5. However, the stacked film 16 illustrated in FIG. 14 includes a stacked film 16a, an insulating layer 21 and a stacked film 16b provided in order above the substrate 11. FIG. 14 further illustrates a memory insulator 22 held between the stacked film 16 and the channel semiconductor layer 2. The memory insulator 22 includes the insulator 5a, the charge storage layer 4 and the tunnel insulator 3 illustrated in FIG. 5 in order.

The stacked film 16a alternately includes the plurality of electrode layers 6 and the plurality of insulating layers 14. The insulating layer 21 is a $SiO_2$ film for example. The stacked film 16b alternately includes the plurality of electrode layers 6 and the plurality of insulating layers 14. Each insulating layer 14 in the stacked films 16a and 16b is a $SiO_2$ film similarly to each insulating layer 14 illustrated in FIG. 5. Each electrode layer 6 in the stacked films 16a and 16b includes the barrier metal layer 6a and the electrode material layer 6b in order similarly to each electrode layer 6 illustrated in FIG. 5, for example. In FIG. 14, illustration of the insulator 5b illustrated in FIG. 5 is omitted.

The memory hole H1 illustrated in FIG. 14 is formed so as to pass through the stacked film 16b, the insulating layer 21 and the stacked film 16a. The memory hole H1 includes a portion Z1 having a width W1, a portion Z2 having a width W2, and a portion Z3 having a width W3. Each of the widths W1, W2 and W3 is a dimension in the XY section of the memory hole H1, and corresponds to the diameter when the XY sectional shape of the memory hole H1 is a circle.

The portions Z1, Z2 and Z3 are formed in the stacked film 16a, the insulating layer 21 and the stacked film 16b, respectively. In the present embodiment, the width W2 of the portion Z2 is larger than the width W1 of the portion Z1 and the width W3 of the portion Z3 (W2>W1, W2>W3). The portion Z2 is also referred to as a joint portion. The portions Z1, Z2 and Z3 are examples of first, second and third portions, respectively. The widths W1, W2 and W3 are examples of first, second and third widths, respectively.

The memory insulator 22, the channel semiconductor layer 2 and the core insulator 1 are formed in order in the memory hole H1. In the present embodiment, since the width of the memory hole H1 is increased in the insulating layer 21, the width of the core insulator 1 is also increased in the insulating layer 21. However, the width of the core insulator 1 may not be increased in the insulating layer 21 when the core insulator 1 is blocked above the insulating layer 21 or the like.

The individual electrode layers 6 of the present embodiment are formed by replacing the sacrifice layers 13 with the electrode layers 6 similarly to the individual electrode layers 6 of the first embodiment. The details of such sacrifice layers 13 will be described later.

FIGS. 15A to 15C are sectional views illustrating a method of manufacturing a semiconductor device of the second embodiment. FIGS. 15A to 15C illustrate the process of forming the insulator 5a in the memory hole H1 similarly to FIGS. 10B to 11A.

FIG. 15A illustrates the stacked film 15 including a stacked film 15a, the insulating layer 21 and a stacked film 15b formed in order above the substrate 11. The stacked film 15a is formed so as to alternately include the plurality of sacrifice layers 13 and the plurality of insulating layers 14. The stacked film 15b is also formed so as to alternately include the plurality of sacrifice layers 13 and the plurality of insulating layers 14. The individual sacrifice layers 13 in the stacked films 15a and 15b are SiN films similarly to the individual sacrifice layers 13 of the first embodiment, for example.

FIG. 15A further illustrates the memory hole H1 formed in the stacked film 15. The memory hole H1 illustrated in FIG. 15A is formed so as to have the widths W1, W2 and W3 as explained with reference to FIG. 14.

In the process illustrated in FIG. 15A, the insulator 5a1 which is a portion of the insulator 5a is formed in the memory hole H1. As a result, the insulator 5a1 is formed on the side face of the stacked film 15 in the memory hole H1. The insulator 5a1 of the present embodiment is a $SiO_2$ film formed by the oxidation, for example. The insulator 5a1 may be a $SiO_2$ film formed by the deposition.

Next, the slimming of the insulator 5a1 is performed (FIG. 15B). Specifically, the liquid chemical to etch the insulator 5a1 is supplied into the memory hole H1. As a result, the insulator 5a1 is removed from the inner peripheral side face of the insulator 5a1. The liquid chemical is the hot NC2, the SC-1 or the dilute hydrofluoric acid aqueous solution, for example.

The slimming in the present embodiment is performed such that the insulator 5a1 remains on the side face of the stacked film 15 though the side face of the stacked film 15 is exposed in the memory hole H1, similarly to the slimming in the first embodiment. The insulator 5a1 remains on the side face of the sacrifice layers 13 and the insulating layers 14 in the stacked films 15a and 15b, similarly to the first embodiment, for example. The insulator 5a1 may further remain on the side face of the insulating layer 21. FIG. 15B illustrates a situation where the insulator 5a1 remains on the side face of the insulating layer 21 near the upper end and the lower end of the portion Z2 illustrated in FIG. 14, as one example. FIG. 15B further illustrates the situation where corners of the insulating layer 21 and the sacrifice layer 13 are rounded due to the effect of the slimming near the upper end of the portion Z1 and near the lower end of the portion Z3 illustrated in FIG. 14, as illustrated by reference characters Ka and Kb. The present embodiment makes it possible to correct the sectional shape of the memory hole H1 to be a circle by the insulator 5a1, similarly to the first embodiment.

Next, the insulator 5a2 which is another portion of the insulator 5a is formed in the memory hole H1 (FIG. 15C). As a result, the insulator 5a2 is formed on the side face of the stacked film 15 and the insulator 5a1 in the memory hole H1. The insulator 5a2 is a $SiO_2$ film formed by the ALD for example. The insulator 5a2 may be a $SiO_2$ film formed by the deposition other than the ALD.

Thereafter, similarly to the first embodiment, the charge storage layer 4, the tunnel insulator 3, the channel semiconductor layer 2 and the core insulator 1 are formed in the memory hole H1, and the individual sacrifice layers 13 are replaced with the electrode layers 6. As a result, the stacked films 15a and 15b are changed to the stacked films 16a and 16b respectively, and the semiconductor device of the present embodiment is manufactured.

FIGS. 16A to 16C are sectional views illustrating a method of manufacturing a semiconductor device of a modification of the second embodiment.

FIGS. 16A to 16C correspond to FIG. 15A to FIG. 15C respectively. However, while the stacked film 15b illustrated in FIG. 15A includes the sacrifice layer 13 as a bottom layer, the stacked film 15b illustrated in FIG. 16A includes the insulating layer 14 as the bottom layer. Even when the bottom layer in the stacked film 15b is the insulating layer 14, the insulator 5a can be formed by a procedure explained with reference to FIGS. 15A to 15C.

As above, the insulator 5a of the present embodiment is formed by forming the insulator 5a1 on the side face of the memory hole H1, removing the insulator 5a1 such that the side face of the memory hole H1 is exposed and the insulator 5a1 remains, and forming the insulator 5a2 thereafter. Accordingly, the present embodiment makes it possible to form the memory hole H1 having the desired characteristics by being able to suppress the electric field concentration onto the convex portion of the memory hole H1 and correct the sectional shape of the memory hole H1 to be a circle or the like.

In the present embodiment, the distorted XY section of the memory hole H1 in some cases appears on the XY section near the lower end of the portion Z1 or the XY section near the lower end of the portion Z3. In addition, the distorted XY section of the memory hole H1 in some cases appears on the XY section of the portion Z2 as illustrated in FIGS. 15B and 16B. The present embodiment makes it possible to correct the sectional shape of the memory hole H1 on the XY sections to be a circle.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a stacked film including a plurality of electrode layers separated from each other in a first direction;
   a first insulator provided on a first part of a side face of the stacked film at a predetermined height in the first direction;
   a second insulator provided on a second part of the side face of the stacked film and a side face of the first insulator at the predetermined height;
   a charge storage layer provided on a side face of the second insulator;
   a third insulator provided on a side face of the charge storage layer; and
   a semiconductor layer provided on a side face of the third insulator,
   wherein the first insulator has an outer peripheral side face having a first curvature radius and an inner peripheral side face having a second curvature radius larger than the first curvature radius.

2. The device of claim 1, wherein each of the first and second insulators includes silicon and oxygen.

3. The device of claim 1, wherein the stacked film further includes a plurality of insulators provided alternately with the plurality of electrode layers in the first direction.

4. The device of claim 3, wherein the first insulator is an insulator different from the plurality of insulators in the stacked film.

5. The device of claim 1, wherein a fourth insulator including the first and second insulators has a shape that the first insulator is projected in a convex shape from an outer peripheral side face of the second insulator.

6. A semiconductor device comprising:
   a stacked film including a plurality of electrode layers separated from each other in a first direction;
   a first insulator provided on a first part of a side face of the stacked film at a predetermined height in the first direction;
   a second insulator provided on a second part of the side face of the stacked film and a side face of the first insulator at the predetermined height;
   a charge storage layer provided on a side face of the second insulator;
   a third insulator provided on a side face of the charge storage layer; and
   a semiconductor layer provided on a side face of the third insulator,
   wherein a fourth insulator including the first and second insulators includes:
   a first region that includes the first and second insulators and has a first thickness; and
   a second region that includes only the second insulator out of the first and second insulators and has a second thickness thinner than the first thickness.

7. The device of claim 6, wherein each of the first and second insulators includes silicon and oxygen.

8. The device of claim 6, wherein the stacked film further includes a plurality of insulators provided alternately with the plurality of electrode layers in the first direction.

9. The device of claim 8, wherein the first insulator is an insulator different from the plurality of insulators in the stacked film.

10. The device of claim 6, wherein the fourth insulator has a shape that the first insulator is projected in a convex shape from an outer peripheral side face of the second insulator.

* * * * *